(12) United States Patent
Billman et al.

(10) Patent No.: US 6,666,692 B2
(45) Date of Patent: Dec. 23, 2003

(54) ELECTRICAL CONNECTOR

(75) Inventors: Timothy B. Billman, Dover, PA (US); Eric D. Juntwait, Hummelstown, PA (US); Charles S. Pickles, York, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/152,936

(22) Filed: May 21, 2002

(65) Prior Publication Data

US 2002/0137400 A1 Sep. 26, 2002

Related U.S. Application Data

(63) Continuation-in-part of application No. 09/746,088, filed on Dec. 21, 2000, now Pat. No. 6,390,857.

(51) Int. Cl.[7] .............................................. H01R 12/00
(52) U.S. Cl. ...................................... 439/76.1; 439/79
(58) Field of Search ................................ 439/680, 608, 439/701, 79, 65, 108, 76.1, 67, 638, 650–654, 607

(56) References Cited

U.S. PATENT DOCUMENTS

| 6,267,604 B1 | * | 7/2001 | Mickievicz et al. | .......... 439/79 |
| 6,350,131 B1 | * | 2/2002 | Shih | ............................. 439/65 |
| 6,350,154 B1 | * | 2/2002 | Fu | .............................. 439/638 |

* cited by examiner

Primary Examiner—Ross Gushi
(74) Attorney, Agent, or Firm—Wei Te Chung

(57) ABSTRACT

An electrical connector (50) mounted on a daughter backplane circuit board is used to mate with a complementary connector (60) mounted on the primary backplane circuit board. The connector (50) includes a top housing (51) and a bottom housing (52) and inner circuit boards (70) installed therebetween. Rows of paired signal contacts (80) and grounding plates (90) are arranged in an alternating sequence within the bottom housing (52) to engage with signal trace pairs (71) on one surface of the inner circuit boards (70) and grounding layers on both surfaces thereof. Similar arrangement of signal contacts and grounding plates (63) is adopted within the complementary connector (60).

20 Claims, 10 Drawing Sheets

ELECTRICAL CONNECTOR

CROSS REFERENCE TO RELATED APPLICATIONS

This application is a continuation-in-part (CIP) of U.S. patent application Ser. No. 09/746,088, filed on Dec. 21, 2000, entitled "Electrical Connector Having Leading Cap for Facilitating Printed Circuit Board in the Connector into a Mating Connector", now U.S. Pat. No. 6,390,857, and is related to U.S. patent application Ser. No. 09/749,086, entitled "Electrical Connector Assembly Having the Same Circuit Boards Therein", filed on Dec. 26, 2000, now issued as U.S. Pat. No. 6,375,508 on Apr. 23, 2002. The disclosure of the above identified applications is incorporated herein by reference.

BACKGROUND OF THE INVENTION

1. Field of the Invention

The present invention is related to a connector assembly with multiple rows and columns of conductive elements, especially to a connector assembly having a plurality of inner circuit boards mounted therein to form needed conductive paths to connect with a daughtercard and a backplane assembly.

2. Description of the Related Art

A backplane assembly includes a primary circuit board with connectors mounted thereon to enable servers/workstations to bring multiple network modules together and harness them to interoperation. Electrical connectors for interconnecting a primary circuit board of the backplane assembly to daughterboards generally comprise two mating connector halves each having multiple rows and columns of conductive elements or contacts. The backplane to daughterboard mating connector halves have a high conductive element/contact density and are required to operate at relatively high electrical speeds. It is known to provide each column of contacts as a separate module that includes a vertical array of contacts having an overmolded carrier. Multiple modules then are installed in a connector housing to form a complete connector. U.S. Pat. Nos. 5,066,236 and 5,664,968 both show such a connector structure. Generally, all of the modules in such a connector are substantially identical. But different types of modules sometimes are needed in a connector in order to accommodate different electrical characteristics of signals through the connector. Besides, due to continuing trends toward miniaturization and improved electrical performance -by the electronics industry, requirements for greater conductive element/contact density and higher electrical speeds are constantly being promulgated. These requirements lead to design conflicts, especially when electrical speeds are in the range of approximately 500 megahertz and above, due to the fact that increasing the contact density places the conductive elements/contacts in closer proximity to each other, thereby leading to crosstalk between neighboring conductive elements/contacts in different signal pairs. Thus, as introduced in U.S. Pat. Nos. 5,104,341 and 6,299,484, some ground reference means are disposed between every two signal modules to reduce crosstalk therebetween.

However, new overmolded technology developing recently shows possibly high production cost may be caused because more and more minimized conductive elements should be assembled together in a small-sized plastic block. It is much difficult to position these high density arranged conductive elements in a overmolding mold due to the high plastic injection pressure and scarce space between these elements. A precise and complicate mold that usually costs high is needed to achieve the production. Therefore, some other substitutes like a circuit board are considered. Robin et al. U.S. Pat. No. 4,571,014 and Paagman U.S. Pat. No. 5,924,899 both show a plurality of inner circuit boards installed inside a backplane connector. Each conductive path on these circuit boards can be thinner and closer to each other than a separate stamping contact of the overmolded module though a perfect small circuit board costs high too. However, an extra solder tail or a mating contact for every conductive path on the circuit board is needed and most of them should be soldered onto the circuit board first before the circuit board is installed into the backplane connector. And the solder joints of every circuit board may be hurt or broken when the backplane connector is mated because the mating force applied on every circuit board can be transferred to its solder joints right away. More fixing or positioning features have to be adopted to overcome this situation and result in a higher product cost.

SUMMARY OF THE INVENTION

Therefore, an object of the present invention is to provide an electrical connector used in a backplane application with inner circuit boards installed therein to achieve a better electrical performance by using a separable and removable connection between the inner circuit boards and other conductors inside the connector.

Another object of the present invention is to provide an electrical connector having larger tolerance to undesired mating displacement of inner circuit boards installed therein and maintaining better electrical performance in a vibration circumstance.

Another object of the present invention is to provide an electrical connector having inner circuit boards which can be replaceable or repairable after the connector is mounted onto a printed circuit board in a simple process without reflow or dismantling the whole connector from the printed circuit board.

Another object of the present invention is to provide an electrical connector having alternately arranged signal and ground transmission path to keep all the signal conductors being surrounded by grounding means throughout the connector and establishing better ground reference neighboring these signal conductors for reducing effectively undesired crosstalk between them.

Another object of the present invention is to provide a connector assembly used in a backplane application having a receptacle connector and its complementary header connector both using mostly identical conductor parts to engage with inner circuit boards installed within the receptacle connector to facilitate the production of both connectors and their assembling process.

To obtain the above objects, an electrical connector in accordance with the present invention includes a top housing and a bottom housing to form a receiving space therebetween. A plurality of parallel partitions extends respectively from the inner face of the top and bottom housing and protruding into the receiving space. Inner circuit boards with traces thereon are respectively inserted and stay in the space between every two partitions of either the top housing or the bottom housing.

Specifically, pairs of signal contacts and grounding plates are installed in the bottom housing. The signal contact pairs are respectively received inside every partition in one row and exposed their engaging arms out of one surface of the partition while each grounding plate is seated and abutting against the other surface of every partition respectively. Meanwhile, each of the inner circuit boards has pairs of signal traces on one surface and a grounding layer formed on the other. So the conductors installed inside the connector include signal transmission pairs and ground means disposed alternately with the signal transmission pair rows throughout the connector though the connector comprises two separate and mating conductors installed therein. Therefore, in high-speed transmission application, the ground means next to every signal transmission pair can provide a better and more effective coupling or ground reference to reduce undesired crosstalk generated therebetween.

Furthermore, due to the separable engagement between the inner circuit boards mostly received in the top housing and the conductors, pairs of signal contacts and grounding plates, received in the bottom housing and the fact of the top housing being removably latched above the bottom housing, the inner circuit boards can be dismantled and replaced anytime even though the connector is mounted on a printed circuit board and no special treatment or process like reflow is needed.

Besides, compressible ridges are disposed on the inner top face of the top housing between every two partitions in spaced-apart relationship. And holes are formed on the top housing and the bottom housing respectively and can be treated as a pair because each hole on the top housing and its related one on the bottom housing are located in the same plane right between two spaced-apart partitions. Two projections corresponding to the holes extend out of edges of every inner circuit board and are inserted in the holes when the connector is assembled. Meanwhile, a plurality of stops abutting against the inner bottom face of the bottom housing is stamped out of the surface of each grounding plate. Every one of the inner circuit board is rested on the top of the stops of a corresponding grounding plate and is pressed by the compressible ridges of the top housing in order to be positioned when the connector is assembled. Therefore, the inner circuit boards can be held in position inside the connector though they are not actually fixed therein. The effective engagement between the boards and conductors in the bottom housing will be continuously maintained by holes of the housings and a flexible mechanism like ridges cooperating with stops of grounding plates when the connector is mated with its complementary connector.

Furthermore, the complementary connector in accordance with the present invention has a housing with similar partition arrangement to the bottom housing of the receptacle connector. Same conductors, including grounding plates and signal contacts used in the bottom housing of the receptacle connector can be adopted again for the same purpose of mating with edges of the inner circuit boards. So the producing cost of the connector assembly can be reduced efficiently.

In addition, on each inner circuit board, signal traces have pads at their both ends for the mating use. Some of the pads have a cut-off area near the mating edge of the inner circuit board in order to keep coincident impedance along the traces when the traces are used to transmit signals. Thus, a better electrical performance can be achieved by the inner circuit board in the high-speed transmission application.

Furthermore, each signal contact used in the bottom housing of the receptacle connector and the complementary connector comprises an flexible engaging arm and tail portion at its two distal ends respectively. And each grounding plate has a plurality of press-fit tails extending therefrom. When the receptacle or complementary connector is mounted on a printed circuit board, the press-fit tails of grounding plates are pressed into the corresponding holes on the printed circuit board to fix the connector and the tail portion of the signal contact can be compressibly engaged on the printed circuit board with a solderless process at the same time. The mounting process of the connectors is simplified and time-saving.

Besides, each grounding plate abutting against a partition of the connector has several flexible beams extending to the other side of the partition, and lanced arms punched out from the grounding plate located next to the surface of the partition. Both of the flexible beam and lanced arms can be engaged with the different inner circuit boards next to the grounding plate and establish more ground conductive path for every inner circuit board. The better coupling and ground reference effect for high-speed signal transmitted by signal contacts next to the grounding plate will be achieved and the whole performance of the connector can be improved.

Other objects, advantages and novel features of the invention will become more apparent from the following detailed description of the present embodiment when taken in conjunction with the accompanying drawings.

DESCRIPTION OF THE PREFERRED EMBODIMENT

Figure 1:
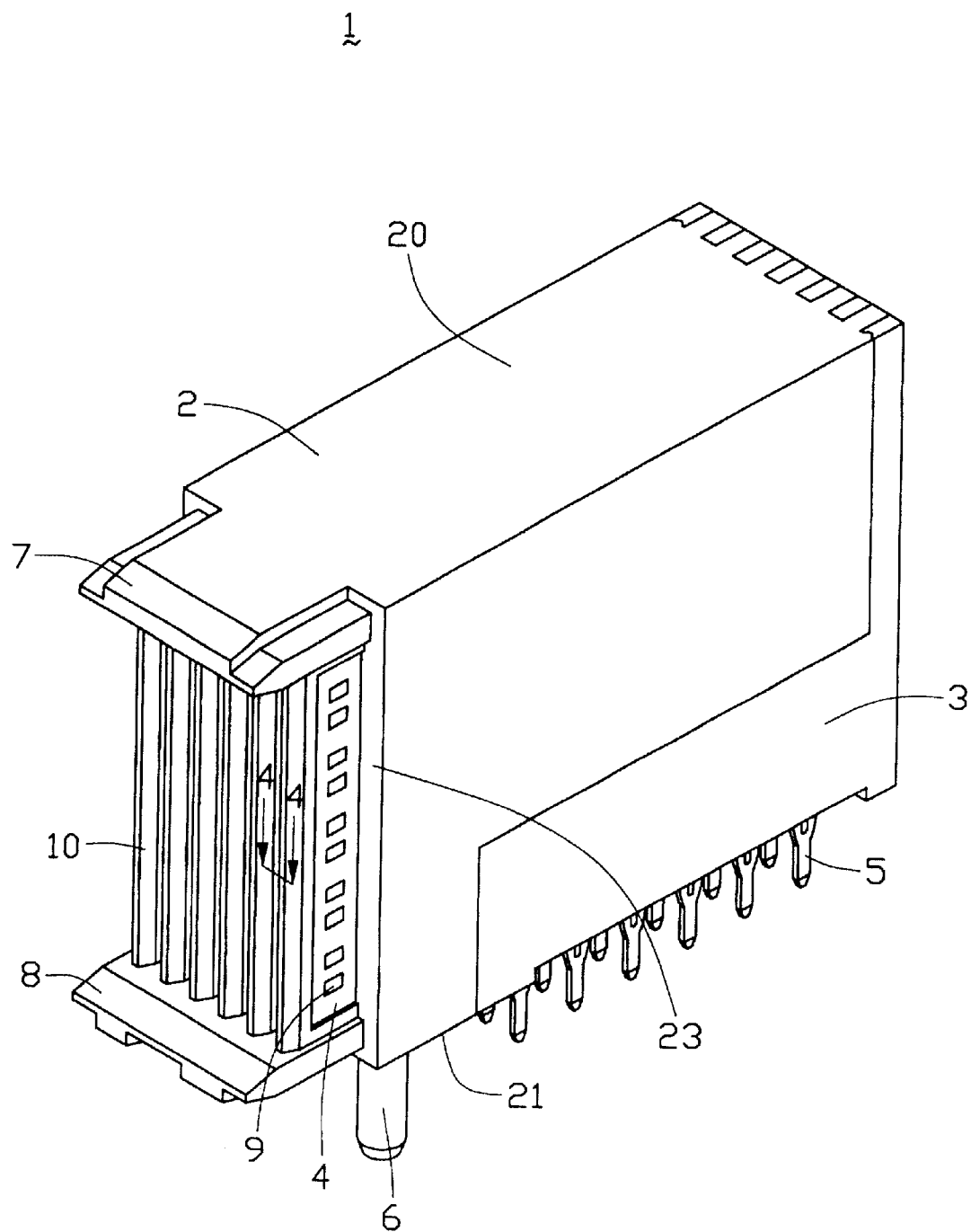
FIG. 1 is a perspective view of an electrical connector in accordance with the present invention.
Figure 2:
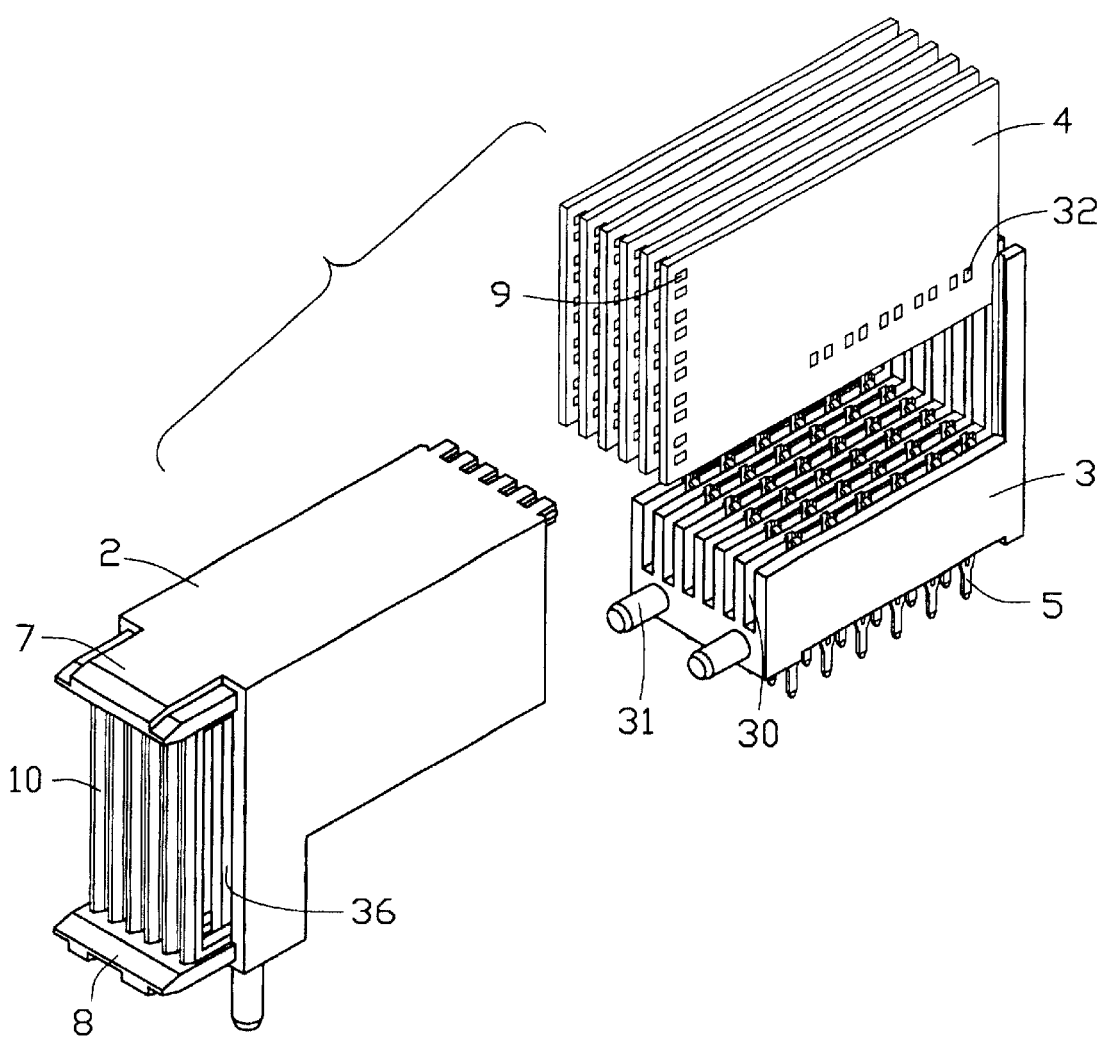
FIG. 2 is an explored view of the electrical connector as shown in FIG. 1.

Referring to FIGS. 1 and 2, an electrical connector 1 in accordance with the present invention comprises a front half 2, a back half 3 and a plurality of circuit boards 4 assembled in the combination of the front half 2 and the back half 3.

The front half 2 and the back half 3 together form a housing of the connector 1. Furthermore, a plurality of grounding terminals 5 and signal terminals (not shown) are positioned in the back half 3, and downwardly extend from the back half 3. The back half 3 defines a plurality of grooves 30 therein. A pair of engaging studs 31 extends forwardly from the back half 3.

Figure 4:
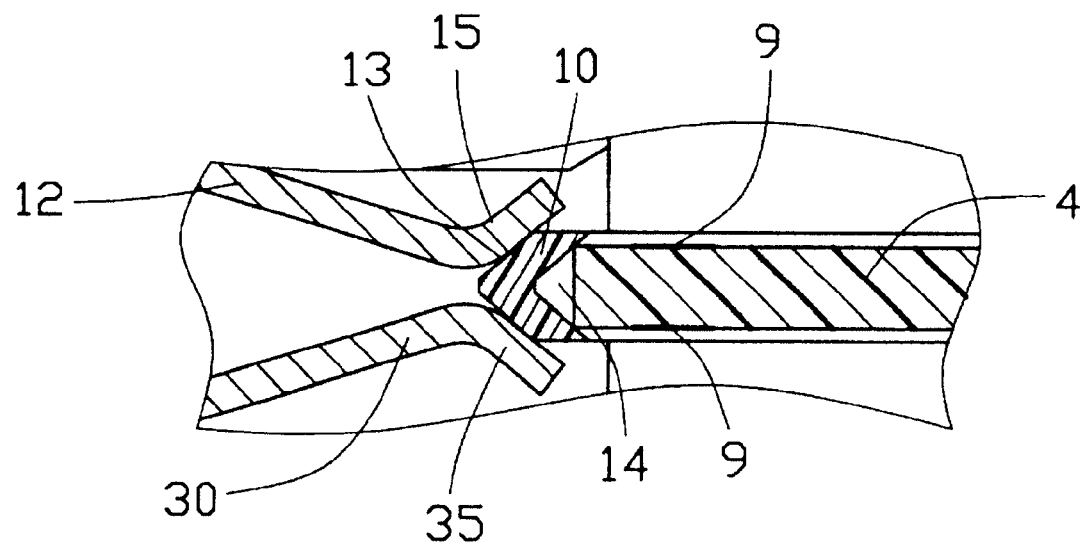
FIG. 4 is a partial, cross-sectional view of the electrical connector with the complementary connector taken along line 4—4 of FIG. 1.

The front half 2 defines a front surface 23, an upper surface 20 and a lower surface 21. A pair of posts 6 (only one visible in FIG. 1) downwardly extends from the lower surface 21 of the front half 2 to locate the electrical connector 1 on a printed circuit board shown with the dotted lines. A top tongue 7 and a bottom tongue 8 forwardly extend from the upper surface 20 and the lower surface 21, respectively. A plurality of leading caps 10 are formed between the top tongue 7 and the bottom tongue 8. In the front half 2, there is a plurality of passageways 36. Referring to FIG. 4, two inclined faces 13 are defined at a front end of each leading cap 10. A swallow-tailed slot 14 is defined at an opposite rear end.

Each circuit board 4 is mounted in the passageway 36 of the front half 2 and the groove 30 of the back half 3, and further extends beyond the front surface 23 of the front half 2 and is ended by the leading cap 10. At one face, a row of first golden fingers 9 is disposed along a front edge of the circuit boards 4, and another row of second golden fingers 32 is disposed vertical to the first golden fingers 9, while at another face, there defines two rows of grounding golden fingers which are similar to the first golden fingers 9 and the second golden fingers 32. Then the grounding terminals 5 engage with the grounding fingers of the circuit boards 4 to establish an electrical connection between the circuit boards 4 and the mated printed circuit board.

In assembly, the circuit boards 4 are received in the combination of the passageways 36 and the grooves 30, and the front half 2 and the back half 3 are assembled together by the pair of engaging studs 31 engaging with corresponding holes (not shown) defined in the front half 2. Each leading cap 10 is positioned at a front edge of a corresponding circuit board 4. When the circuit boards 4 are assembled in the front half 2 and the back half 3, the swallow-tailed slots 14 each engage with the front edge of a corresponding circuit board 4, while the two inclined faces 13 face the mating direction.

Figure 3:
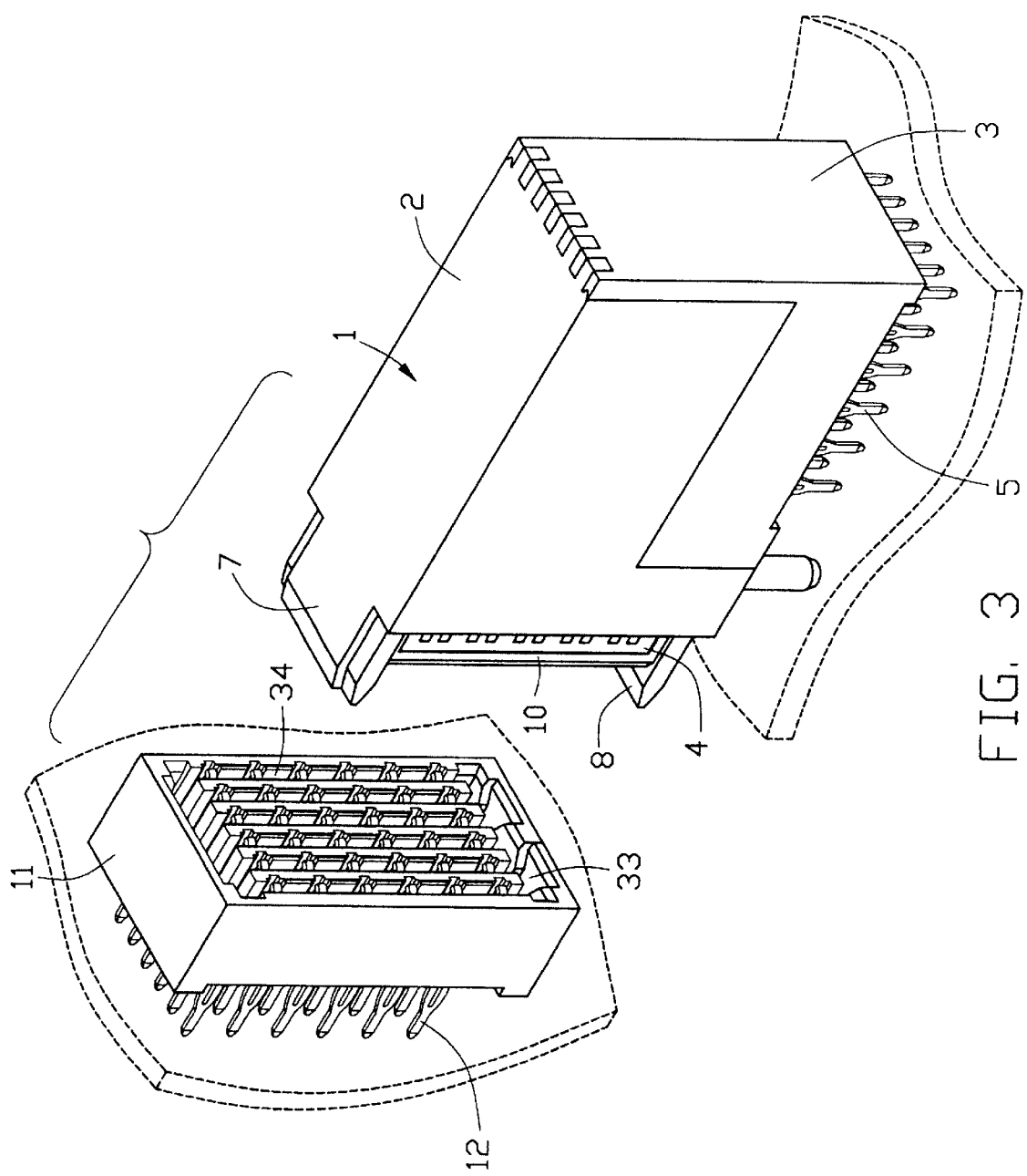
FIG. 3 is perspective view of the electrical connector of FIG. 1 from a rear aspect, and a complementary connector to be mated with the electrical connector.

Referring to FIG. 3, a complementary connector 11 which can be located on another printed circuit board shown with the dotted lines, defines a pair of slots 33 at opposite ends thereof, and a plurality of grooves 34 therein. A plurality of grounding contacts 12 and signal contacts 30 (see FIG. 4) are received in the grooves 34. Each of the grounding contacts 12 and the signal contacts 30 comprises an engaging section 15, 35 at a free end thereof.

FIG. 4 shows the protective function of the leading cap 10 when the electrical connector 1 mates with a complementary connector 11. When mating, the top tongue 7 and the bottom tongue 8 are inserted into the slots 33 of the complementary connector 11, the grounding contacts 12 and the signal contacts 30 engage with corresponding golden fingers of the circuit boards 4. In the process of engagement, the engaging sections 15, 35 of the grounding contacts 12 and the signal contacts 30 slide over the inclined faces 13 to engage with corresponding golden fingers 9 of the circuit board 4.

Figure 5:
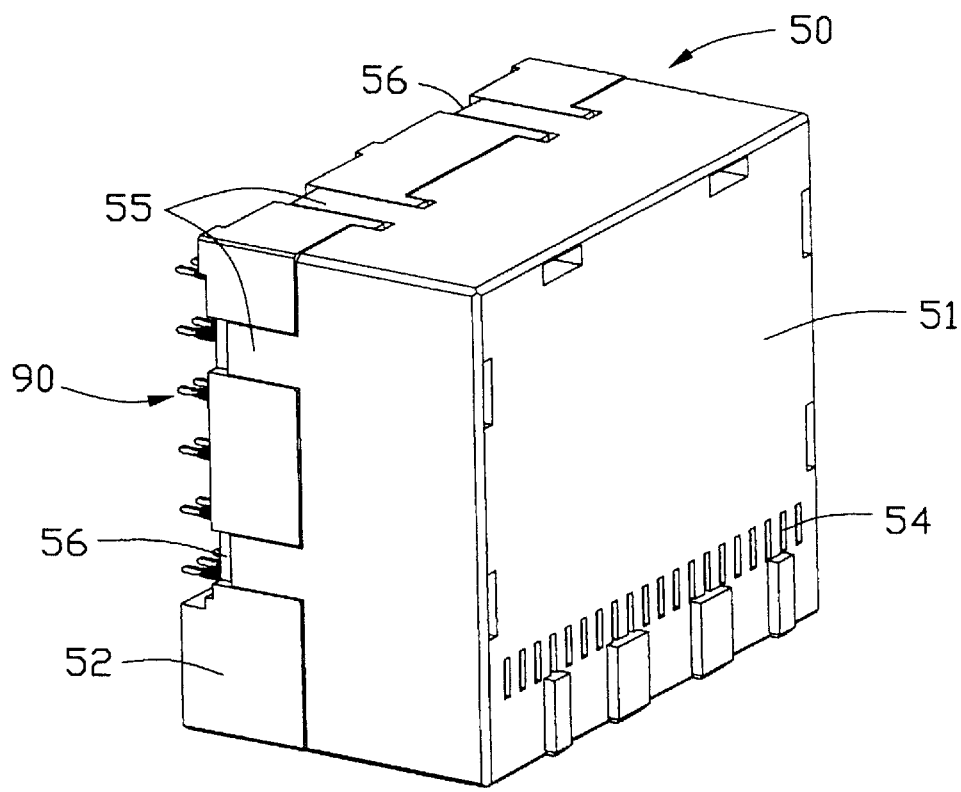
FIG. 5 is a perspective view of an electrical connector and its mating male connector in accordance with a second embodiment of the present invention.
Figure 5:
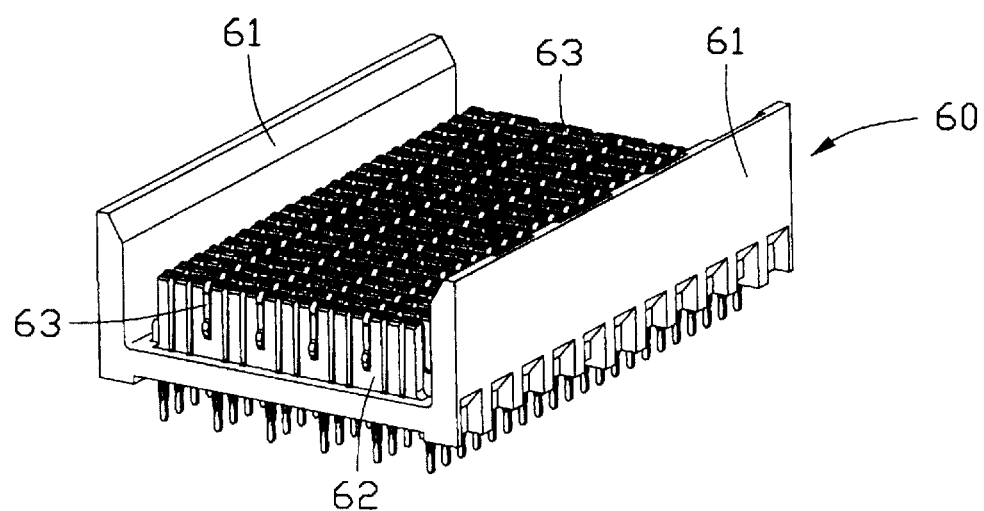
Figure 6:
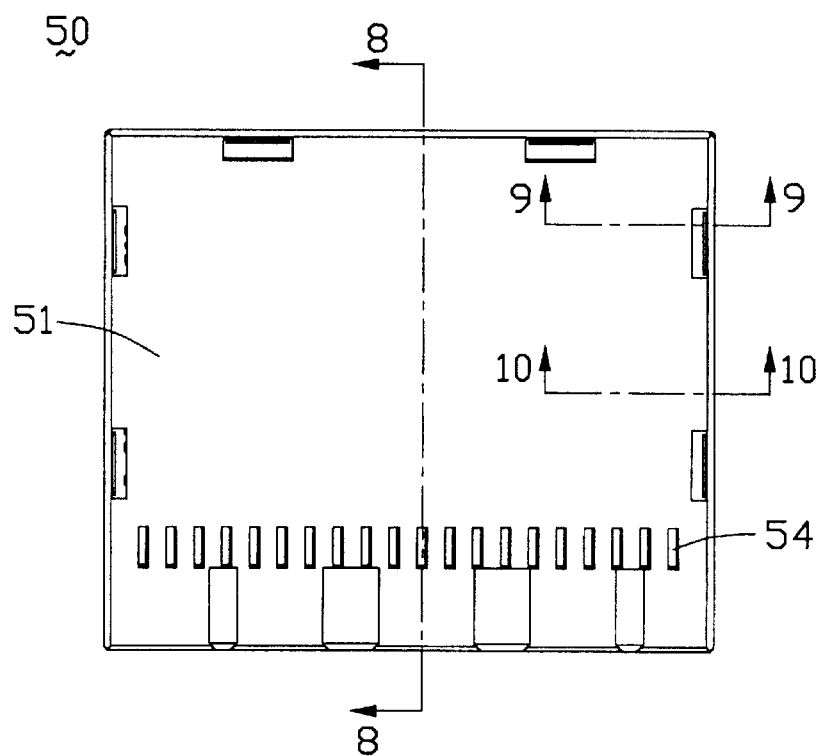
FIG. 6 is a top side view of the electrical connector as shown in FIG. 5.
Figure 7:
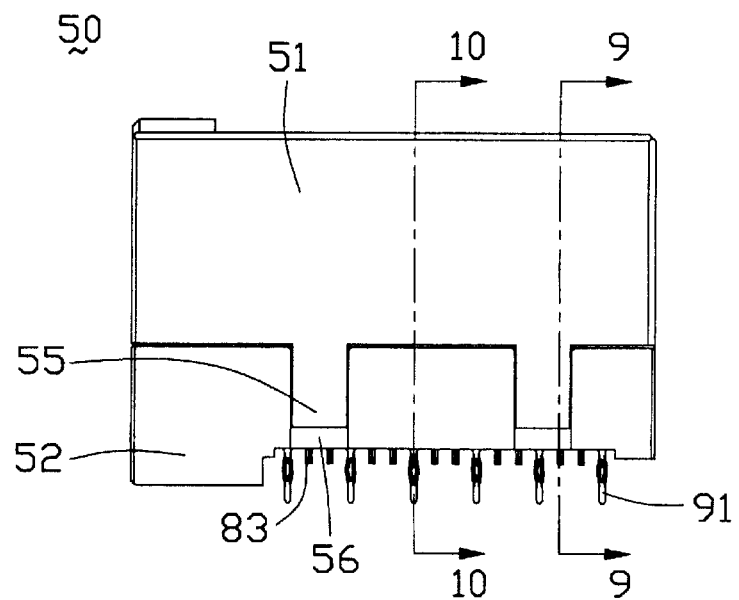
FIG. 7 is a lateral side view of the electrical connector as shown in FIG

Referring to FIGS. 5 to 7, a second embodiment of the electrical connector 50 in accordance with the present invention is shown mating with its complementary connector 60. The receptacle type electrical connector 50 includes a top housing 51 and a bottom housing 52 being assembled together to form a receiving space therebetween. The top housing 51 has a top wall, a rear wall and two sidewalls extending from the edges of the top wall and partially surrounding the receiving space. A plurality of partitions 53 (shown in FIG. 9) are formed extending from the inner face of the top wall and protruding into the receiving space. These partitions 53 are parallel arranged and spaced from each other. Several compressible ridges 531 are disposed on the inner face of the top wall between two partitions in spaced-apart relationship. Each of these ridges 531 can extend from one partition to the other perpendicular to surfaces of partitions or in a predetermined angle. A row of holes 54 are formed on the top wall of the top housing 51 and each of these holes 54 is disposed between two parallel partitions 53. And a pair of locking arms 55 extends from the lower edge of the rear wall and two sidewalls respectively. The bottom housing 52 has a bottom wall, rear wall and two sidewalls corresponding to the top housing 51 to enclose the receiving space together. Grooves 56 each having a step 57 disposed therein (shown in FIG. 9) are formed on the outer surface of the rear wall and sidewalls of the bottom housing 52 corresponding to locking arms 55 of the top housing 51 in order to lock the top and bottom housing 51, 52 together when any of the locking arm 55 moves along one of the grooves 56. Referring to FIGS. 10 and 11, a plurality of partitions 58 are disposed extending from the inner face of the bottom wall of the bottom housing 52 and each partition 58 is located basically in the same vertical plane as one of the corresponding partition 53 of the top housing 51. Two rows of recesses 581, 582 are disposed respectively on two surfaces of the partition 58 and recesses 581 on one surface are formed deeper than others 582 on the other surface. A row of holes 59 is disposed on the bottom wall of the bottom housing 52 corresponding to the holes 54 of the top housing 51 and each of these holes 59 is located in the same plane as its corresponding hole 54 of the top housing 51.

Figure 9:
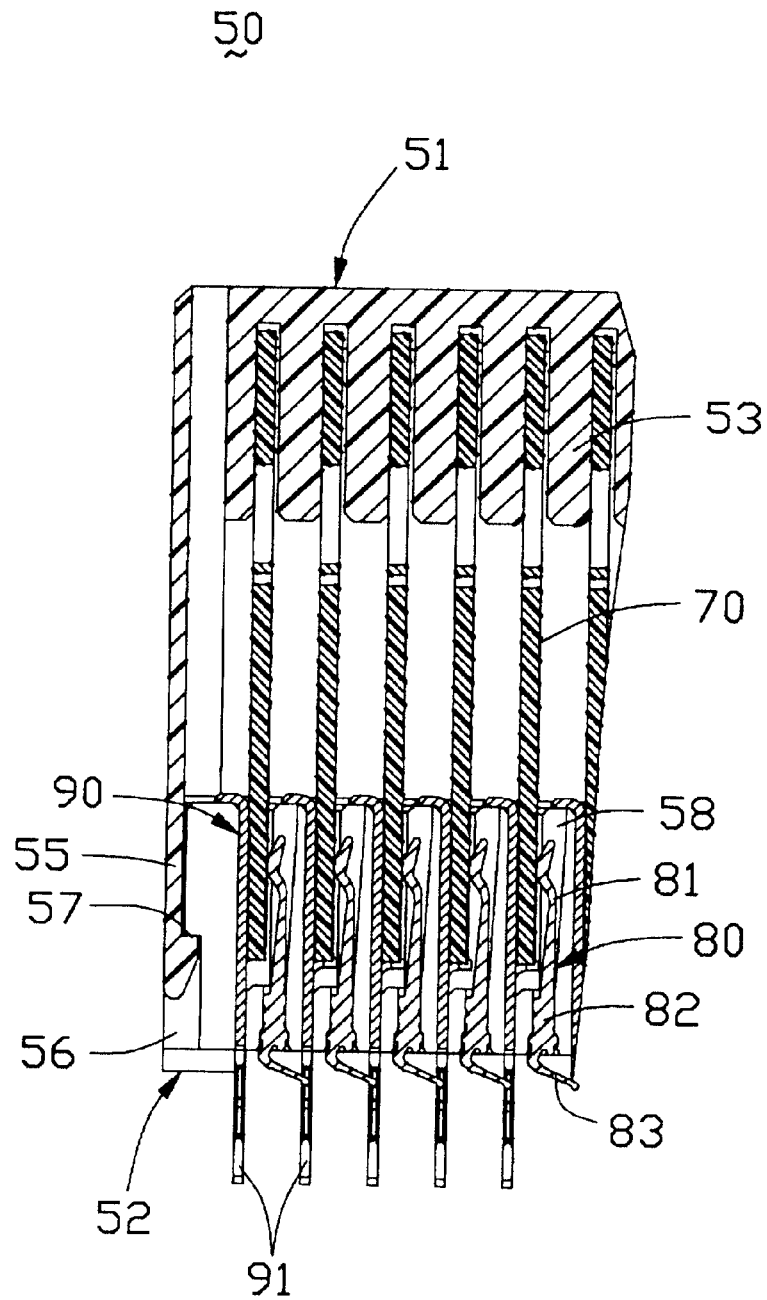
FIG. 9 is a partially sectional view of the electrical connector showing the engagement between electrical conductors and the inner circuit boards inside the connector along the 9—9 line in FIG. 6 and FIG. 7.
Figure 10:
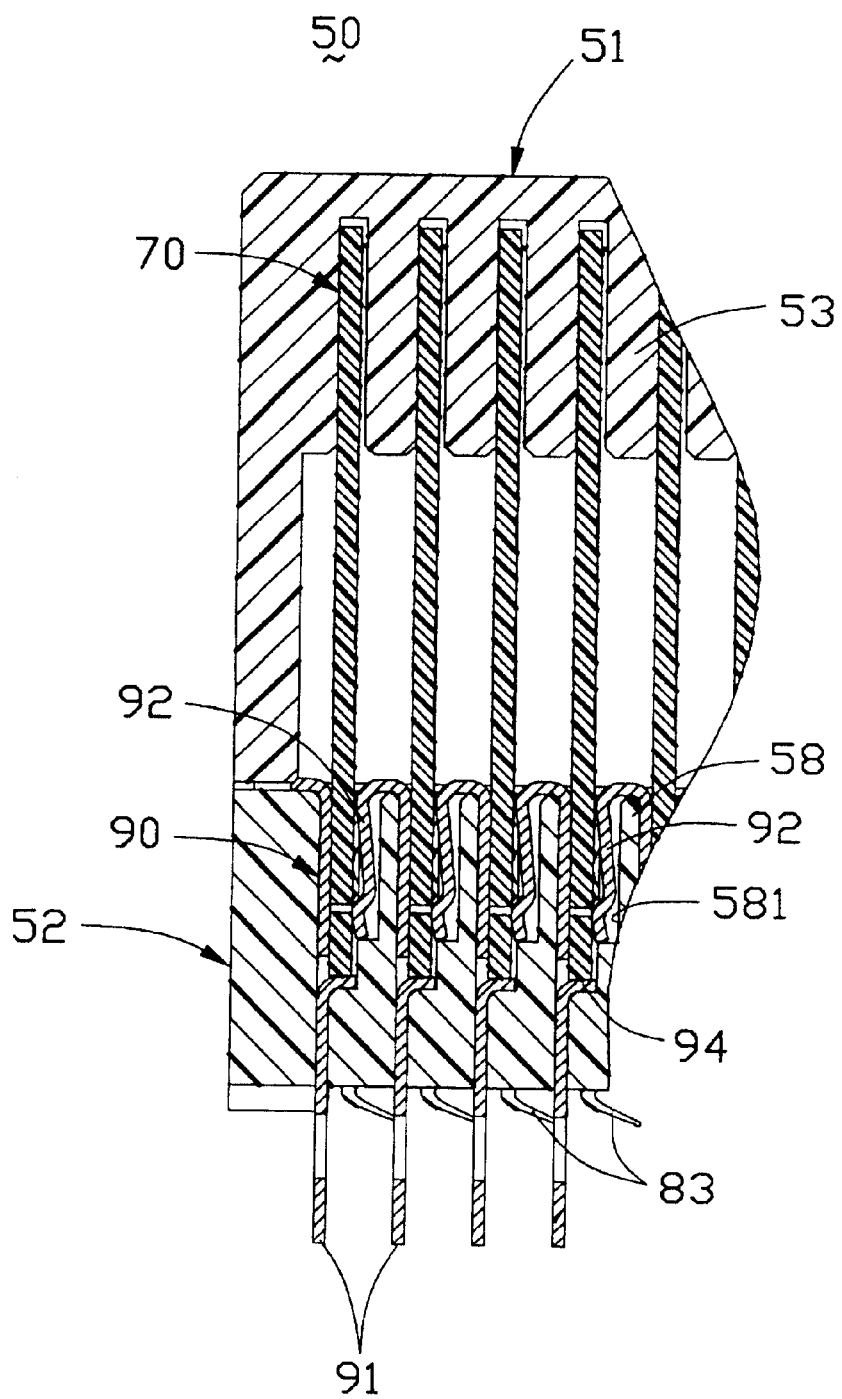
FIG. 10 is a partially sectional view of the electrical connector shown in FIG. 6 and FIG. 7 along the 10—10 line showing one of the electrical conductor, grounding plates, engaged with their neighboring inner circuit boards.
Figure 11:
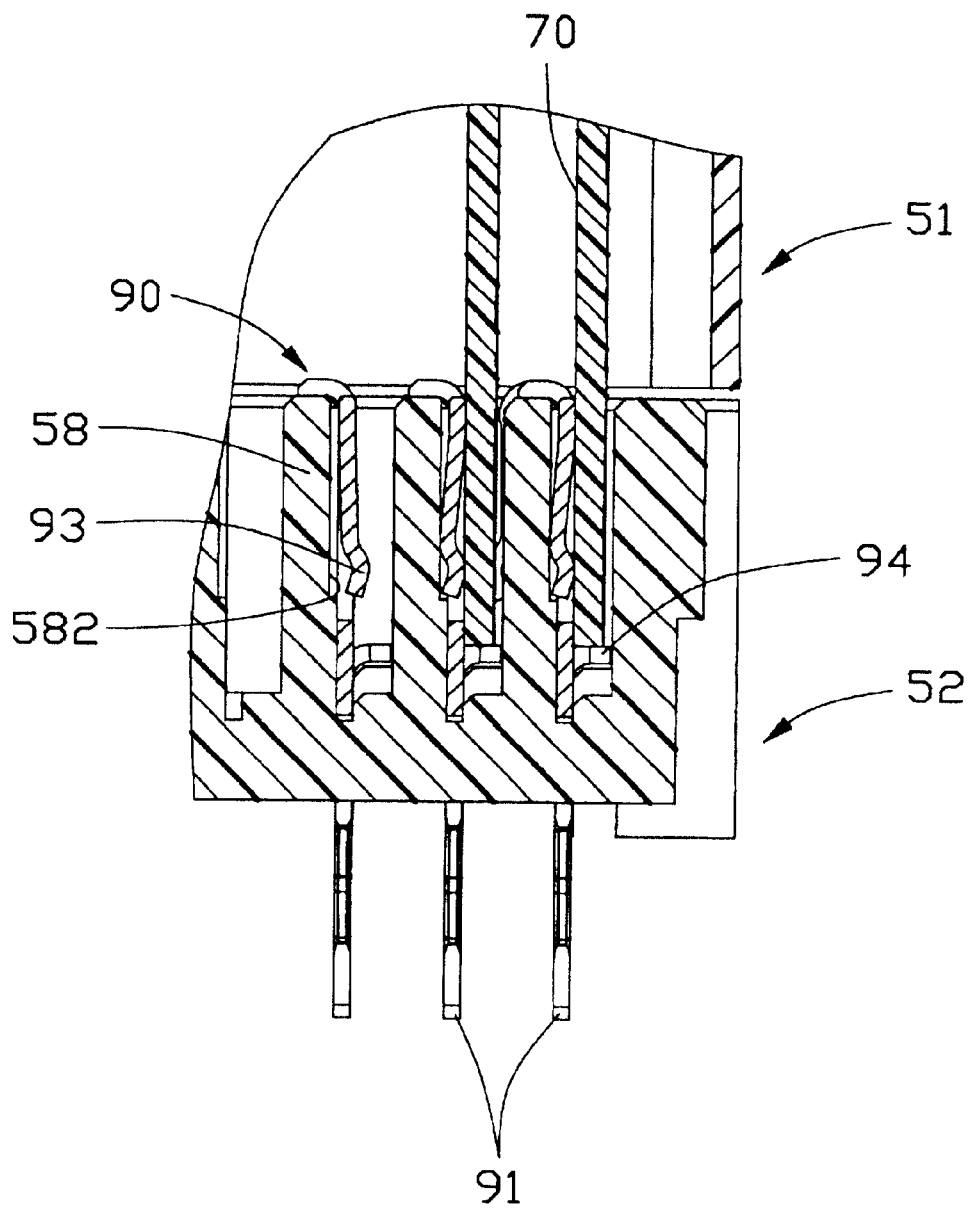
FIG. 11 is a partially sectional view of the electrical connector shown in FIG. 1 showing the engagement of some grounding plates and their neighboring inner circuit boards on the other side thereof without signal any contact installed.

Referring particularly to FIGS. 9 to 11, two kinds of electrical conductors are received in the bottom housing 52. One kind of the conductors, pairs of signal contacts 80, are installed in the bottom housing 52 and resting inside every partition 58 in one row. Each signal contact comprises a retention portion 82 used to fix the whole signal contact 80 in its related partition 58, an engaging arm 81 flexibly extending from the retention portion 82 upwards and having an contacting end disposed beyond one surface of the partition 58, and a tail portion 83 extending from the retention portion 82 and extending out of the lower face of the bottom housing 52 in order to be compressively engaged with conductive traces of the daughter backplane circuit board (not shown). The other conductors, however, are grounding plates 90 seated on every partition 58 respectively. Each grounding plate 90 includes a plate-like base (not exactly shown) abutting against one surface of a partition 58 with a plurality of press-fit tails 91 extending from the lower edge of the base. These tails 91 and tail portions 83 of signal contacts 80 are alternately arranged along the same line below every partition 58 to avoid short circuit happening between these two kinds of conductors 80, 90. Every tail 91 of grounding plates 90 is pressed fit in a corresponding hole on the daughter backplane circuit board when the receptacle connector 50 is mounted thereon. Thus, the whole connector 50 can be held in position on the daughter backplane circuit board by these press-fit tails 91 and signal contacts 80 gain enough normal compressing force to have their tail portions 83 effectively engaged with pads connecting to traces on the daughter circuit board.

Besides, several flexible beams 92 extend from the top edge of every grounding plate 90 and are bent abutting against the other surface of the partition 58. Each flexible beam 92 exposes its end beyond the partition 58 surface though most portions of the flexible beam 92 are received in a corresponding recess 581 disposed thereon. On the base surface of each grounding plate 90, lanced arms 93 are punched out therefrom and located next to the shallower recesses 582 formed on the surface of the partition 58 where the base of the grounding plate 90 abuts. The lanced arms 93 then gain enough space to move flexibly when they are engaged with any inner circuit board 70. Meanwhile, a plurality of stops 94 is stamped out of the base surface of each grounding plate 90. These stops 94 can be shaped as a vertically extending tab partially seated on the inner face of the bottom wall of the bottom housing 52 or a vertically risen shear-out protrusion with top and bottom sheared edges. Every one of the inner circuit board 70 is rested on the top of the flexible stops of a corresponding grounding plate in order to be positioned vertically when these parts are assembled.

Figure 8:
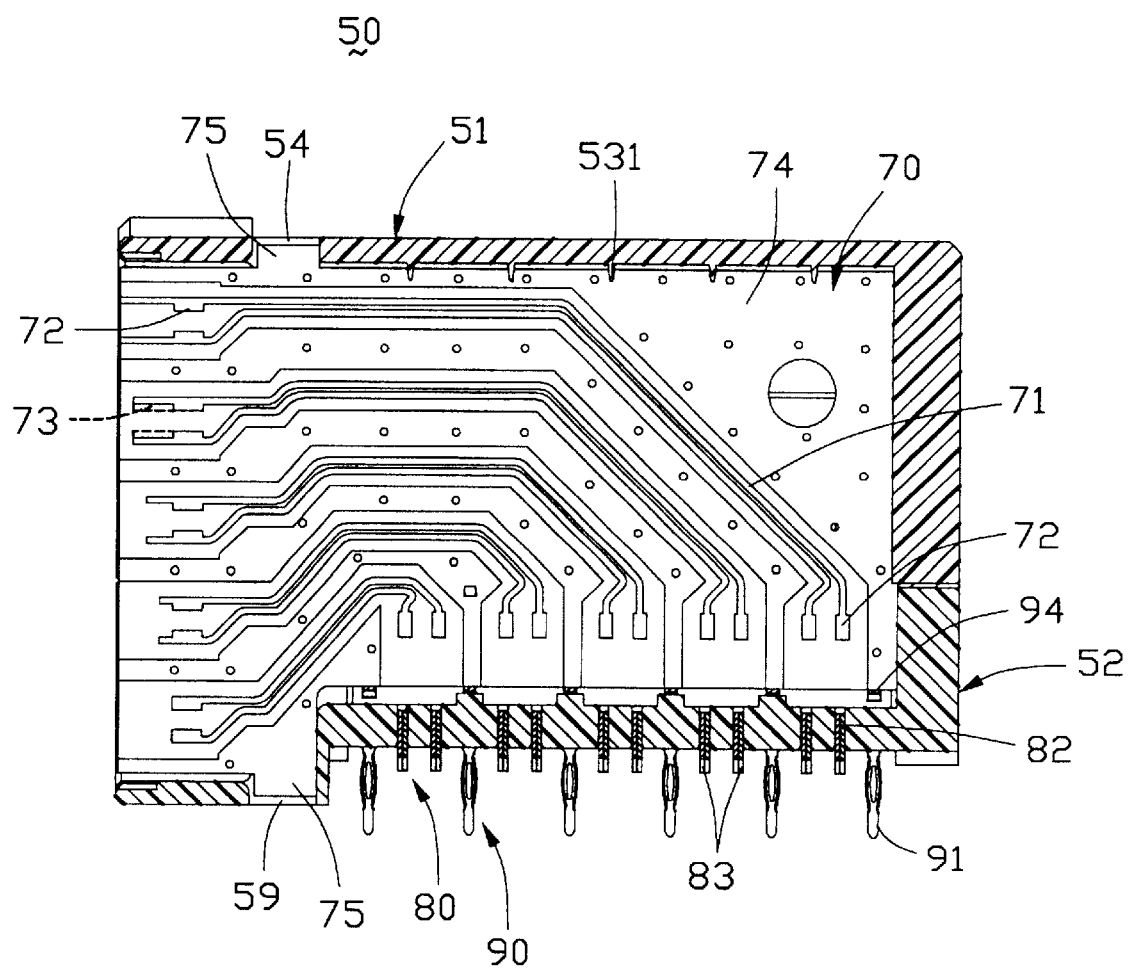
FIG. 8 is a sectional view of the electrical connector showing an inner circuit board installed therein along the 8—8 line in FIG. 6.

Referring to FIG. 8, a plurality of inner circuit boards 70, used as main conductors in the connector 50, are received in the receiving space with portions of them resting between the partitions 53 of the top housing 51 respectively. Every inner circuit board has pairs of signal traces 71 on one surface and a grounding layer (no shown) formed on the other. Basically the signal trace pairs 71 are parallel arranged and spaced apart from each other on the board surface and a grounding layer 74 is disposed either between two neighboring signal pairs 71 or partially surrounding one signal pair 71. Each of signal traces of every pair 71 has pads 72 at its both ends. The pads 72 at one end of these signal traces 71 are aligned near a mating edge of the inner circuit board 70 in order to be engaged with the conductors received in the bottom housing 52. And the pads 72 at the other end of these signal traces 71 are aligned near another mating edge of the inner circuit board 70 used to mate with the complementary connector 60. These mating-use pads 72 all have a cut-off area 73 (shown one only by dash lines in FIG. 8) near the mating edge of the inner circuit board 70 in order to keep coincident impedance along the trace of a signal transmission path because the impedance of the transmission path varies when a pad 72 is always wider than its connected trace 71. Similarly, a cut-off area of the grounding layer on the other side of the inner circuit board 70 neighboring any one of the pads 72 can affect the impedance of the signal transmission path by a similar coupling way. Two projections 75 extend out of the top and bottom edges of every inner circuit board 70 and are inserted in the holes 54, 59 of the top housing 51 and bottom housing 52 respectively in order to position the board 70 in the mating direction.

Referring to FIGS. 5 and 8 to 10, it is understandable, when the connector 50 is going to be assembled, the conductors including signal contacts 80 and grounding plates 90 of the bottom housing 52 are first installed. The signal contacts are installed in the partition 58 of the bottom housing 52 and keep their engaging arms 81 partially exposed out of one surface of the partition 58. And each grounding plate 90 is installed abutting against the other surface of one partition 58 and its flexible beams 92 are hung down in the recesses 581 on the same exposing surface of the partition 58 as signal contacts 80. Then inner circuit boards 70 are respectively inserted into slots formed between partitions 58 and seated on stops 94 of the grounding plates 90 next to these boards 70 and the bottom of the slots. The engaging arm 81 of every signal contact 80 is then electrically engaged with the corresponding pad 72 of every signal trace pair 71 of one inner circuit board 70 while the flexible beams 92 of the grounding plate 90 installed on the same partition 58 as these contact 80 are electrically engaged with grounding layers 74 surrounding the signal trace pairs 71. And the lanced arms 93 of the same grounding plate 90 are electrically engaged with the grounding layer of a second circuit board 70 next to the previously mentioned one. Obviously, the distance between the engaging area of grounding layer 74 and the bottom edge of the inner circuit board 70 is different from the one between the signal pads 72 and the same edge. Therefore, the insertion of each inner circuit board 70 into its related slot of the bottom housing 52 is easier due to smaller insertion (or engaging) force needed. Finally, the subassembly of inner circuit boards 70 and the bottom housing 52 is covered by the top housing 51 with locking arms 55 of the top housing 51 sliding in the grooves 56 of the bottom housing 52 and being locked therein to put the two housing parts together. The upper portion of every inner circuit board 70 is received in the space between partitions 53 of the top housing 51. And the whole circuit board 70 is releasably kept in position by engaging with stops 94 of the grounding plate 90 at its bottom and compressible ridges 531 of the top housing 51 at its top to be prevented from excess moving in a direction along the circuit board surface. Two projections 75 of every inner circuit board 70 are movably received in hole 54, 59 of the top and bottom housing to prevent the board from backward moving when the connector 50 is mated with its complementary connector 60.

Referring again to FIG. 5, the complementary connector 60, a header one for the backplane assembly connection mostly mounted on the primary backplane circuit board, has a housing with a bottom wall and two shrouds 61 vertically extending from the opposing sides of the bottom wall. A plurality of partitions 62 is integrally formed with the bottom wall and protrusively extending therefrom. These partitions 62 are parallel arranged and spaced apart from each other. Conductors, including grounding plates 63 and signal contacts (not shown), are installed onto/in partitions of the complementary connector 60. Basically the structural feature or function of grounding plates 63 and signal contacts of the complementary connector 60 is mostly identical to those conductors in the bottom housing 52 of the receptacle connector 50. Therefore, the producing cost of the complementary connector 60 can be reduced. And most of the advantages mentioned about the receptacle parts can be achieved by the complementary connector as well.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
    a connector housing having at least two separable housing parts and each housing part including electrical conductors installed therein, the conductors received in one housing part being separably engaged with the conductors received in the other; wherein
        the one housing part and the conductors installed therein are removable and repairable after the electrical connector is mounted on a printed circuit board for normal work; wherein said two housing parts are a top and a bottom housing assembled along a direction perpendicular to the mounting surface of the printed circuit board; wherein
the conductors received in the top housing are a plurality of inner circuit boards with traces thereon, these inner circuit boards are parallel arranged and spaced apart from each other.

2. An electrical connector comprising:
a connector housing having at least a first and a second separable housing parts;
a plurality of inner circuit boards being received in the first housing part and each having signal traces on a first surface thereof and grounding traces on a second surface thereof;
two kinds of conductors being received in the second housing part to transmit signal and ground data respectively, said signal conductors being arranged in a plurality of rows to engage with the signal traces on the fist surface of the inner circuit boards, and said ground conductors being arranged in alternated rows between every two signal conductor rows to engage with the grounding traces on the second surface;
a transmitting path formed by every engaged signal trace and signal conductor being surrounded by the a ground means formed by neighboring and engaged grounding traces and grounding conductors to get the needed complete ground reference for better high-speed signal transmission.

3. The electrical connector as recited in claim 2, wherein the grounding trace on the second surface of each inner circuit board is an integrally plane-like grounding layer, said grounding layer is used to be the ground reference of every signal traces on the first surface of the same inner circuit board and the signal traces on the fist surface of the inner circuit board next to it.

4. The electrical connector as recited in claim 3, wherein the grounding conductor in the second housing part has a plate-like base abutting against one of the inner circuit boards.

5. The electrical connector as recited in claim 4, wherein the signal conductors in the second housing part are paired and aligned in rows and each row is located between every two grounding conductors.

6. The electrical connector as recited in claim 5, wherein the first and the second housing parts are a top and a bottom housings.

7. An electrical connector comprising:
a connector housing being adapted to be seated on a printed circuit board and being adapted to mate with a complementary connector;
at least a first and a second kinds of conductors and a third conductor being received in the connector housing, the first kind of conductors and the second kind of conductors engaging with said third conductor;
each of the first kind of conductors being compressed to be adapted to electrically connect to the printed circuit board, the second kind of conductors each being a plate-like grounding plate with a plurality of press-fit tails extending therefrom and being adapted to be mounted on the printed circuit board to provide a compressing force the first kind of conductors need.

8. The electrical connector as recited in claim 7, wherein the connector is a receptacle connector and the complementary connector is a header connector, and the third conductor is a plurality of inner circuit boards installed inside the connector housing.

9. The electrical connector as recited in claim 8, wherein the connector housing includes a top and a bottom housing, and the inner circuit boards are received in the top housing and both of the first and second kinds of conductors are received in the bottom housing.

10. The electrical connector as recited in claim 7, wherein the first conductor is paired signal contacts each having a fixing-use retention portion with an engaging arm and a tail portion extending from its opposite ends respectively, the engaging arm is used to engage with one of the third conductors, and the tail portion is used to compressibly engage with the printed circuit board.

11. The electrical connector as recited in claim 7, wherein the connector is a header connector and the complementary connector is a receptacle connector, and the third conductor is a plurality of inner circuit boards installed inside the complementary connector.

12. An electrical connector comprising:
a connector housing assembly being adapted to be seated on a printed circuit board and including a top and a bottom housings;
a plurality of inner circuit boards being received in the connector housing assembly and having traces thereon to transmit signals;
a flexible mechanism disposed inside the connector housing assembly and holding every inner circuit board in position inside the connector housing assembly, the flexible mechanism comprising compressible ridges disposed on an inner face of the top housing and located right above and engaged with the inner circuit boards to together with the bottom housing provide an enough holding force to the inner printed circuit boards; and
separate conductors received in the bottom housing and separably engaged with the traces of every inner circuit board, the conductors including signal and grounding ones.

13. The electrical connector as recited in claim 12, wherein each grounding conductor has a plate-like base abutting against one of the inner circuit boards, and several stops are sheared from the base to have the one of inner circuit boards seated thereon.

14. An electrical connector seated on a printed circuit board and mating with a complementary connector comprising:
a connector housing having a plurality of inner circuit boards received therein, each inner circuit board having traces on one surface thereof and engaging pads formed along two mating edges, the first mating edge being adapted to mate with conductors in the complementary connector;
at least one kind of conductors being received in the connector housing, the conductors engaging with the pads along the second mating edge of every inner circuit board in a direction perpendicular to a surface of the inner circuit board;
the engagement of the conductors and the pads of one of the inner circuit board being maintainable and movable along the surface of the inner circuit board though slight displacement being caused by a mating of the inner circuit board and the conductors in the complementary connector.

15. A connector assembly comprising:
a header connector having a housing and a plurality of first conductors received therein;
a receptacle connector having a matable housing adapted to mate with the header connector, a plurality of inner circuit boards received in the matable housing and having at least two mating edges with conductors disposed thereon, one mating edge being exposed to outside of the matable housing in order to engage with the first conductors of the header connector and the other one staying inside the matable housing;

the receptacle connector has comprising a plurality of second conductors received in the matable housing, the second conductors being mostly identical to the first conductors and being engaged with the other mating edge by the same way as the first conductors.

16. The connector assembly as recited in claim 15, wherein both of the first and second conductors include paired signal contacts transmitting signals and grounding plates used as ground reference of signals.

17. A connector assembly comprising:

a header connector having a housing with a mating face and a plurality of conductors received therein;

a receptacle connector having a matable housing matable with the header connector, a plurality of inner circuit boards being received the matable housing and each inner circuit board having a mating edge used to mate with the conductors of the header connector for signal transmission; some of the conductors engaging with the mating edge of the inner circuit boards in positions at a first distance away from the mating face of the header connector and other conductors engaging with the mating edge of the inner circuit board in positions at a second distance away from the mating face.

18. An electrical connector assembly comprising:

an insulative housing defining a plurality of parallel elongated grooves;

a plurality of printed circuit boards received in the grooves, respectively;

a plurality of signal contacts located by one side of each of said grooves and mechanically and electrically engaged with corresponding pads on one side of corresponding printed circuit board received in said each of the groove; and an elongated grounding plate located by the other side of each of said grooves and mechanically and electrically engaged with corresponding pads on the other side of corresponding printed circuit board received in said each of the grooves;

the grounding plate defining a plurality of mounting tails extending downwardly and essentially coplanar with a plane essentially defined by the grounding plate;

each of the signal contacts located right beside one groove defining a tail portion extending toward another grounding plate located right beside another groove neighboring said one groove, instead of toward the corresponding grounding plate sharing the said same one groove with said each of the signal contacts.

19. An electrical connector comprising:

a connector housing having at least two separable housing parts and each housing part including electrical conductors installed therein, the conductors received in one housing part being separably engaged with the conductors received in the other; wherein the one housing part and the conductors installed therein are removable and repairable after the electrical connector is mounted on a printed circuit board for normal work; wherein said two housing parts are a top and a bottom housing assembled along a direction perpendicular to the mounting surface of the printed circuit board; wherein the top housing has locking arms extending downwards to be separably locked in corresponding grooves formed on outer surfaces of the bottom housing.

20. An electrical connector comprising:

a connector housing having at least two separable housing parts and each housing part including electrical conductors installed therein, the conductors received in one housing part being separably engaged with the conductors received in the other; wherein the one housing part and the conductors installed therein are removable and repairable after the electrical connector is mounted on a printed circuit board for normal work; wherein said two housing parts are a top and a bottom housing assembled along a direction perpendicular to the mounting surface of the printed circuit board; wherein the conductors received in the bottom housing includes rows of signal contact and grounding plates alternately arranged therein.

\* \* \* \* \*